(12) United States Patent
Butera et al.

(10) Patent No.: US 11,429,831 B2
(45) Date of Patent: Aug. 30, 2022

(54) RFID READER WITH AUTOMATIC TUNING

(71) Applicant: RF IDeas, Inc., Rolling Meadows, IL (US)

(72) Inventors: John C. Butera, Palatine, IL (US); Rajani Pidaparti, Buffalo Grove, IL (US)

(73) Assignee: RF IDEAS, INC., Rolling Meadows, IL (US)

( * ) Notice: Subject to any disclaimer, the term of this patent is extended or adjusted under 35 U.S.C. 154(b) by 760 days.

(21) Appl. No.: 15/903,726

(22) Filed: Feb. 23, 2018

(65) Prior Publication Data
US 2019/0057293 A1 Feb. 21, 2019

Related U.S. Application Data

(60) Provisional application No. 62/546,391, filed on Aug. 16, 2017.

(51) Int. Cl.
| | | |
|---|---|---|
| G06K 19/07 | (2006.01) |
| H01Q 1/22 | (2006.01) |
| H03H 7/40 | (2006.01) |
| H03H 7/01 | (2006.01) |
| H03J 7/04 | (2006.01) |
| H03J 5/24 | (2006.01) |

(52) U.S. Cl.
CPC ....... *G06K 19/0726* (2013.01); *H01Q 1/2216* (2013.01); *H03H 7/0138* (2013.01); *H03H 7/40* (2013.01); *H03J 5/24* (2013.01); *H03J 7/04* (2013.01); *H01Q 1/2225* (2013.01); *H03J 2200/06* (2013.01)

(58) Field of Classification Search
CPC ............ G06K 19/0726; H01Q 1/2216; H03H 7/0138; H03H 7/40; H03J 5/24; H03J 7/04
See application file for complete search history.

(56) References Cited

U.S. PATENT DOCUMENTS

| | | |
|---|---|---|
| 6,070,803 A | 6/2000 | Stobbe |
| 6,317,027 B1 | 11/2001 | Atkins |
| 6,903,656 B1 | 6/2005 | Lee |
| 7,439,860 B2 | 10/2008 | Andresky |
| 7,592,961 B2 | 9/2009 | Thober et al. |
| 8,219,053 B2 | 7/2012 | Mejia et al. |
| 8,249,500 B2 | 8/2012 | Wilson |
| 8,536,982 B2 | 9/2013 | Waters |
| 8,576,021 B2 | 11/2013 | Hill |
| 8,934,837 B2 | 1/2015 | Zhu et al. |

(Continued)

OTHER PUBLICATIONS

International Search Report dated Oct. 24, 2018 from corresponding PCT application.

*Primary Examiner* — Samuel S Outten
(74) *Attorney, Agent, or Firm* — Hoffmann & Baron, LLP (57) ABSTRACT

An RFID reader, tuning method and computer readable medium. A carrier signal is transmitted. A plurality of feedback signals produced in the RFID reader are measured when transmitting the carrier signal with a variable matching network set at a plurality of impedance values that are different from one another. It is determined which impedance value of the plurality of impedance values produced a feedback signal having a highest level of the plurality of feedback signals. The variable matching network is set to the determined impedance value.

16 Claims, 4 Drawing Sheets

(56) References Cited

U.S. PATENT DOCUMENTS

| | | |
|---|---|---|
| 8,977,197 B2 | 3/2015 | Krishnan et al. |
| 9,087,282 B1 | 7/2015 | Hyde et al. |
| 2005/0219132 A1 | 10/2005 | Charrat |
| 2007/0222605 A1* | 9/2007 | Andresky ............ G06K 7/0008 340/572.7 |
| 2013/0109305 A1* | 5/2013 | Savoj ............... G06K 19/07749 455/41.1 |
| 2014/0106668 A1 | 4/2014 | Krishnan et al. |
| 2015/0227832 A1* | 8/2015 | Diorio .............. G06K 19/07754 235/492 |
| 2016/0070942 A1 | 3/2016 | Dor et al. |
| 2016/0112028 A1* | 4/2016 | Baier .................... H01L 23/495 343/861 |
| 2016/0141882 A1* | 5/2016 | Ichikawa ................ H02J 50/80 307/104 |
| 2016/0180125 A1 | 6/2016 | Schuster et al. |

* cited by examiner

RFID READER WITH AUTOMATIC TUNING

RELATED APPLICATION

This Application claims priority under 35 USC 119(e) to U.S. Provisional Application Ser. No. 62/546,391, filed Aug. 16, 2017, entitled "RFID READER WITH AUTOMATIC TUNING", which is herein incorporated by reference in its entirety.

BACKGROUND

1. Technical Field

The techniques described herein relate generally to RFID readers, and in particular to automatic tuning of an RFID reader.

2. Discussion of the Related Art

Radio-Frequency Identification (RFID) is a technology used for identifying and/or tracking items such as consumer products, identification cards, etc. Items to be tracked and/or identified are provided with an RFID tag. An RFID tag includes electronics storing identification information. An RFID reader may be configured to transmit a radio wave interrogation signal at a predefined frequency. When the RFID tag receives the interrogation signal, it transmits its identification information to the RFID reader. The RFID reader reads the received identification information, and then various actions can be taken such as allowing access to an individual, logging the presence of an item tagged with the RFID tag, etc.

SUMMARY

Some embodiments relate to a tuning method for an RFID reader, the tuning method comprising: transmitting a carrier signal; measuring a plurality of feedback signals produced in the RFID reader when transmitting the carrier signal with a variable matching network set at a plurality of impedance values that are different from one another; determining which impedance value of the plurality of impedance values produced a feedback signal having a highest level of the plurality of feedback signals; and setting the variable matching network to the determined impedance value.

The plurality of impedance values may be a plurality of capacitance values.

The method may further comprise waiting to initialize an RFID tag between transmitting the carrier signal and measuring a first feedback signal of the plurality of feedback signals.

The plurality of feedback signals may be measured at a receive terminal of the RFID reader.

The feedback signals may represent a voltage of the variable matching network.

The determining may comprise comparing the plurality of feedback signals to one another to determine which of the plurality of feedback signals has the highest level of the plurality of feedback signals, and determining the impedance value that produced the highest level.

The determining may comprise comparing feedback signals to determine whether a feedback signal decreased with respect to a previously-measured feedback signal, and, if so, determining that the previously-measured feedback signal has the highest level of the plurality of feedback signals, and determining the impedance value that produced the highest level.

The measuring may comprise setting an initial impedance value of the variable matching network based on a last known best tuning value for the variable matching network.

The last known best tuning value may be determining by tuning the variable matching network without waiting for initialization of an RFID tag in a field of the RFID reader.

Some embodiments relate to an RFID reader, comprising: an antenna; a variable matching network connected to the antenna; and circuitry configured to: measure a plurality of feedback signals produced in the RFID reader when transmitting the carrier signal with the variable matching network set at a plurality of impedance values that are different from one another; determine which impedance value of the plurality of impedance values produced a feedback signal having a highest level of the plurality of feedback signals; and set the variable matching network to the determined impedance value to read an RFID tag.

Some embodiments relate to a control circuit for an RFID reader, comprising: circuitry configured to: measure a plurality of feedback signals produced in the RFID reader when transmitting the carrier signal with a variable matching network set at a plurality of impedance values that are different from one another; determine which impedance value of the plurality of impedance values produced a feedback signal having a highest level of the plurality of feedback signals; and set the variable matching network to the determined impedance value to read an RFID tag.

The circuitry may be configured to control the impedance of the variable matching network by controlling the plurality of switches.

The circuitry may be configured to set an initial impedance value of the variable matching network based on a last known best tuning value for the variable matching network.

The last known best tuning value may be determined by tuning the variable matching network without waiting for initialization of an RFID tag in a field of the RFID reader.

Some embodiments relate to RFID reader, comprising: a transmitter/receiver circuit having a transmit terminal and a receive terminal; a variable matching network coupled to the transmit terminal; a feedback circuit configured to provide a voltage representing a signal transmitted by the transmitter/receiver circuit to the receive terminal as a feedback signal; and a controller configured to vary an impedance of the variable matching network, wherein the RFID reader is configured to determine an impedance of the variable matching network that produces a highest feedback signal at the receive terminal of the transmitter/receiver circuit, and to set the variable matching network to the determined impedance value to read an RFID tag.

The RFID reader may further comprise an antenna coupled to the variable matching network.

The variable matching network may comprise a variable capacitor.

The variable capacitor may comprise a plurality of capacitors and a plurality of switches, each capacitor of the plurality of capacitors being connected in series with a switch of the plurality of switches.

The controller may be configured to control the impedance of the variable matching network by controlling the plurality of switches.

The controller may be configured to set an initial impedance value of the variable matching network based on a last known best tuning value for the variable matching network.

Some embodiments relate to a non-transitory computer readable storage medium having stored thereon instructions, which, when executed by a processor, perform a tuning method for an RFID reader, the tuning method comprising: measuring a plurality of feedback signals produced in the RFID reader when transmitting a carrier signal with a variable matching network set at a plurality of impedance values that are different from one another; determining which impedance value of the plurality of impedance values produced a feedback signal having a highest level of the plurality of feedback signals; and setting the variable matching network to the determined impedance value.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

The inventor(s) have recognized and appreciated that due to manufacturing variations in RFID readers or tags, different mounting surfaces for the RFID reader or other variations in the environment in which an RFID reader is operated, an RFID reader antenna matching network having a fixed impedance may not be optimally tuned, which can reduce the RFID reader's effectiveness at reading RFID tags. To address these variations, an RFID reader may include a variable matching network that is tuned using a suitable tuning process. An auto-tuning process may be used to find the optimal matching network impedance. Accordingly, an RFID reader may be made flexible to account for process, device and/or environmental variations.

Figure 1:
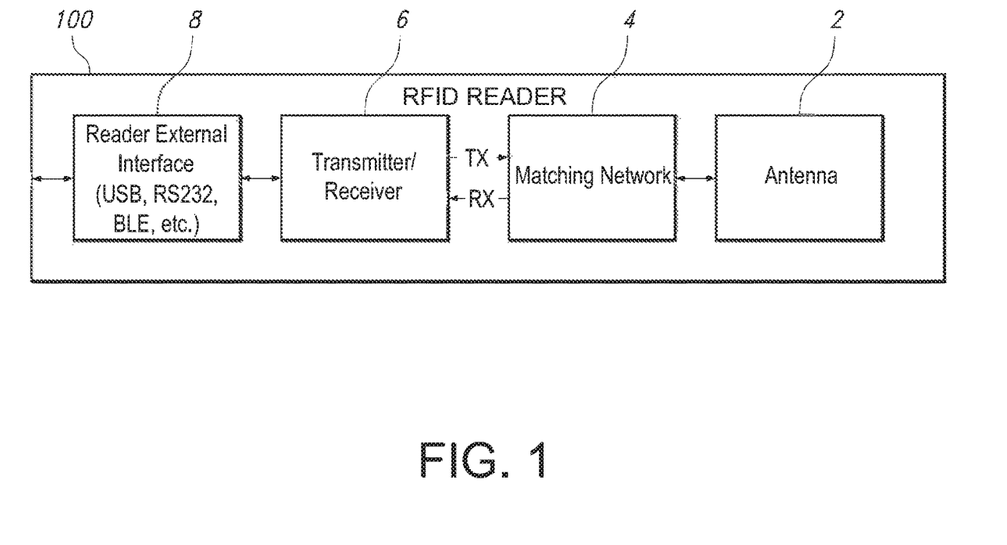
FIG. 1 shows a block diagram of an RFID reader.

Prior to discussing the tunable matching network and auto-tuning process, a block diagram of an RFID reader will be described. FIG. 1 shows a block diagram of an RFID reader 100. The RFID reader 100 includes an antenna 2, a matching network 4, a transmitter/receiver circuit 6 (hereinafter "transmitter/receiver 6"), and an external interface 8. The antenna 2 is configured for transmitting an interrogation signal to one or more RFID tags, and receiving responses from one or more RFID tags. The transmitter/receiver 6 may include transmitter circuitry for driving the antenna 2 at a suitable frequency and power level to transmit the interrogation signal. The transmitter/receiver 6 may include receiver circuitry for detecting the response signals from the one or more RFID tags and extracting their identification information. Suitable transmitter circuitry and receiver circuitry is known in the art and will not be detailed herein. In some embodiments, the transmitter/receiver 6 may transmit and/or receive signals at a frequency of 13 MHz. When the identification information is extracted from a received signal, it may be provided to an external computing device via the external interface 8. Any suitable external interface may be used, including wired or wireless interfaces. Examples include a Universal Serial Bus (USB) interface, a RS232 interface, a Bluetooth interface, etc. Matching network 4 includes one or more passive components for interfacing the antenna 4 to the transmitter/receiver 6.

Figure 2:
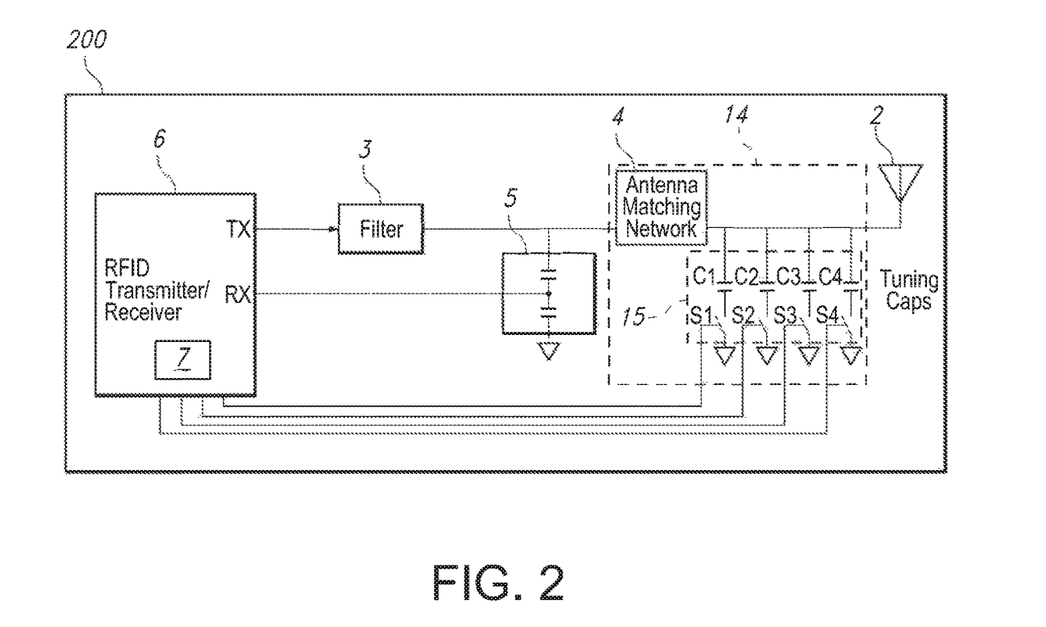
FIG. 2 shows components of an RFID reader.

FIG. 2 shows components of an RFID reader 200, according to some embodiments. RFID reader 200 includes a transmitter/receiver 6, a variable matching network 14, an antenna 2, a filter 3 connected to a transmit terminal TX of the transmitter/receiver 6, and a voltage feedback network 5 connected to a receive terminal RX of the transmitter/receiver 6. The variable matching network 14 may include a fixed antenna matching network 4 and a variable passive component 15 having a variable impedance. The variable passive component 15 may be a variable capacitor having a variable capacitance, as illustrated in FIG. 2. A variable capacitor may include a plurality of capacitors C in series with respective switches S1-S4, to allow the capacitors C to be switched into or out of the circuit. Closing a switch S1-S4 connects a terminal of a corresponding capacitor to ground. The other terminal of the capacitors C are connected to the antenna 2. Thus, closing a switch S1-S4 connects a corresponding capacitor between the antenna and ground. The variable antenna matching network 14 is tuned by setting the capacitance of the variable capacitor, which is performed by selecting the switches S1-S4 that are closed. Control signals are provided to the respective switches S1-S4 to open or close them. In some embodiments, the control signals may be provided by a controller 7 of the transmitter/receiver 6 or another controller.

The variable capacitor may have any suitable number of capacitors. In the embodiment shown in FIG. 2, the variable capacitor has four capacitors C1-C4 connected in series with four respective switches S1-S4. However, a smaller or larger number of capacitors may be used, such as two, three, five, six or greater, as the techniques described herein are not limited as to the number of capacitors. In some embodiments, the capacitors C may have binary-weighted capacitance values, which can increase the range of capacitance values provided by a given number of capacitors. For example, if the capacitors are binary-weighted, they may have capacitance values of C, 2C, 4C, and 8C respectively, which allows producing sixteen different capacitance values by connecting different combinations of the capacitors. In some embodiments, the capacitance value C may be on the order of picofarads (pF), such as 1-20 pF (e.g., 10 pF). However, this is merely by way of example, as the techniques described herein are not limited to the particular type or configuration of a variable capacitor or its particular capacitance values.

In some embodiments, the selection of the variable capacitor range and step size may be determined by measuring the capacitance values needed to tune the RFID reader at the extremes. For example, the capacitance needed for tuning may be measured when the RFID reader is placed on a grounded metal plate or other object, when the RFID reader is in the open air with no tag/card present and/or when the RFID reader is near a tag/card that loads the RFID reader heavily. From such measurements, maximum and minimum capacitance values can be determined.

Figure 3:
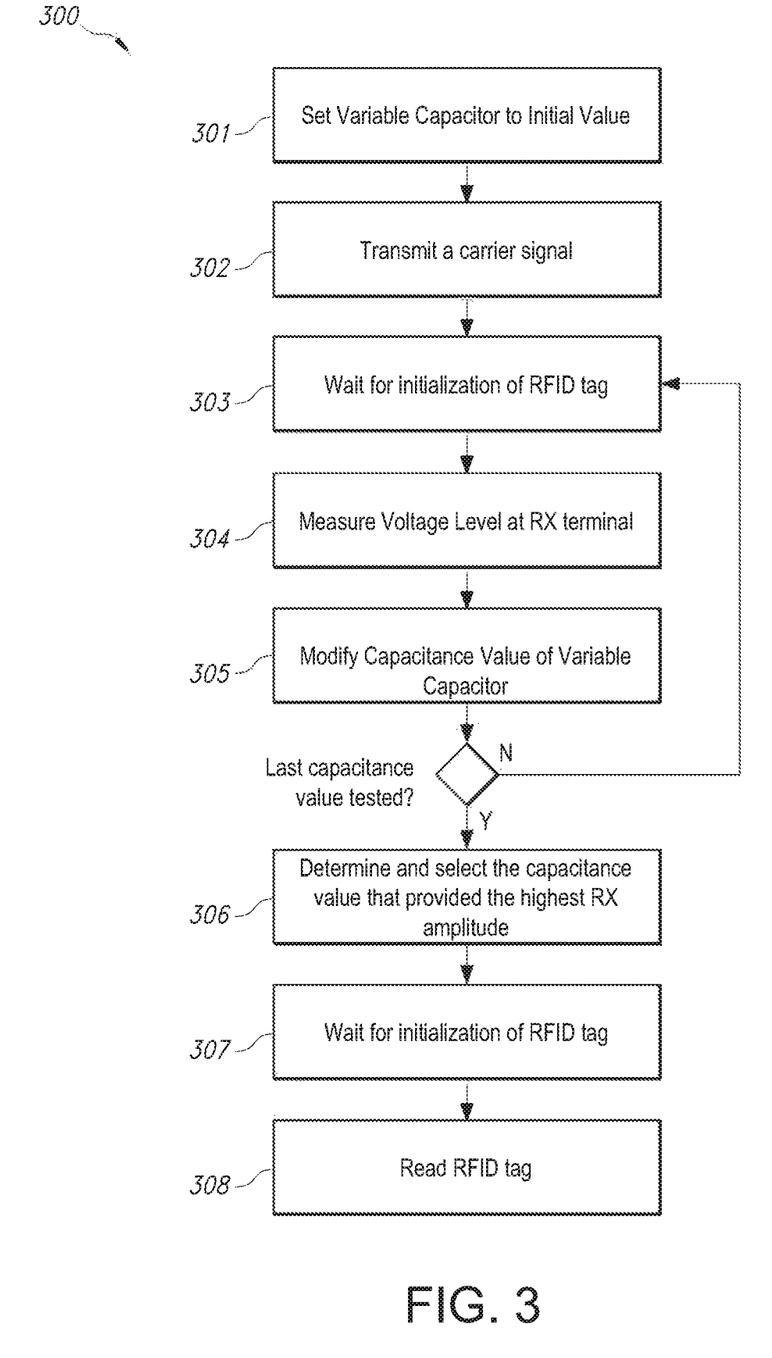
FIG. 3 shows a flowchart illustrating an example of an auto-tuning method.

Having described a variable capacitor and a way in which its capacitance can be varied, an example of an auto-tuning process for the RFID reader 200 will be described. FIG. 3 shows a flowchart illustrating an example of an auto-tuning method 300, according to some embodiments.

In step 301, the capacitance of the variable capacitor is set to an initial value. This may be controlled by the controller 7 of transmitter/receiver 6, which may send control signals to the variable capacitor to set its initial state. For example, in some embodiments, the switches S may be set to all closed (producing a highest capacitance value) or all open (producing a lowest capacitance value).

In step 302, the RFID reader 200 may begin transmitting a carrier signal at a predetermined frequency for interrogating RFID tags. The transmitter/receiver 6 may generate a signal at the transmit (TX) terminal which then passes through filter 3 and the variable antenna matching network 14 to the antenna 2. The output of the transmitter/receiver 6 may be a square wave. Filter 3 can remove the harmonics so that only a predetermined frequency of the RFID card is transmitted by the antenna. Filter 3 may be a low-pass filter.

In step 303, the RFID reader may wait for a period of time for an RFID tag to be initialized. For example, in some embodiments the RFID reader may wait 5 milliseconds, or another suitable period of time. The inventor(s) have appreciated the loading effect on the RFID reader's field while the RFID tag is "powered off" may be significantly different from the loading effect of the RFID tag when the RFID tag is "powered on" and has completed its own internal reset or initialization processes. Accordingly, waiting until the RFID tag is initialized before making measurements may allow for consistent tuning based on the RFID tag being in an initialized state.

In step 304, a voltage level may be measured at the receive (RX) terminal of the transmitter/receiver 6. The RX terminal is provided with a feedback signal from the voltage feedback network 5. The voltage feedback network 5 is configured to produce a signal at the RX terminal representative of the voltage in the transmit signal path at the input of the variable matching network 14. The voltage received by the feedback network 5 may be many times larger in voltage than the transmitter/receiver 6 can read at the RX terminal. The voltage feedback network 5 conditions the received signal to the RX terminal so the signal has a voltage level suitable for reception at the RX terminal of the receiver. In some embodiments, voltage feedback network 5 may be a voltage divider that divides down the voltage in the transmit signal path to a lower voltage. The voltage divider may be an AC voltage divider that uses capacitors to divide down the voltage, as illustrated in FIG. 2. The voltage level of the feedback signal at the RX terminal may be measured in any suitable way. The voltage level may be measured as the peak-to-peak voltage of the feedback signal, the amplitude of the feedback signal, an RMS value, or any other suitable metric for the voltage level. The RFID reader may then store the voltage level of the feedback signal it measures (e.g., in a register or memory).

In step 305, the capacitance value of the variable capacitor is modified. In some embodiments, the auto-tuning process may iterate through consecutive capacitance values, either increasing or decreasing, by incrementally increasing or decreasing the capacitance after each measurement step 304. The modification of the capacitance value can be performed by the transmitter/receiver 6 sending suitable control signals to set the switches S1-S4 into a suitable configuration to produce the next capacitance value in the sequence. Steps 303-305 are then repeated for a number of capacitance values of the variable capacitor. However, it should be appreciated that the method 300 is not limited to incrementally increasing or decreasing the capacitance values, as in some embodiments the variable capacitance values may be tested in any order.

Once the last capacitance value has been tested by performing step 304, the method may then proceed to analyzing the measurements. This analysis may be performed by the controller 7 or any other suitable processor or circuit. In step 306, the voltage levels of the feedback signals at each capacitance value are analyzed to determine which one is the highest, and the capacitance value that produced the highest feedback voltage level is selected for reading an RFID tag. This may correspond to approximately the resonant frequency of the RFID reader/tag system for the particular operating environment in which the auto-tuning process is performed.

In step 307, the RFID reader 200 may wait for a period of time for an RFID tag to be initialized. For example, in some embodiments the RFID reader may wait 5 milliseconds, or another suitable period.

Finally, in step 308, an attempt may be made to read the RFID tag.

Figure 4:
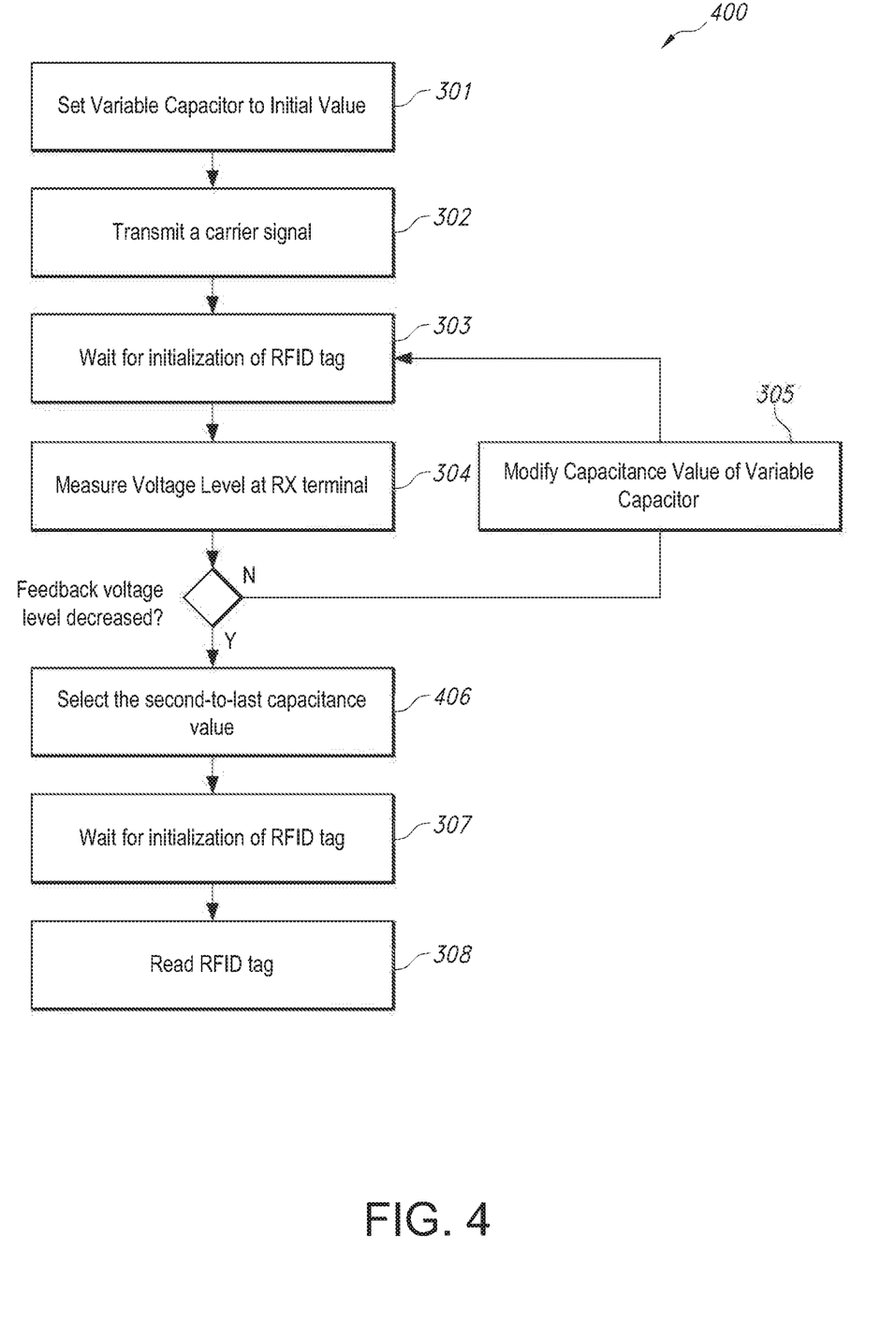
FIG. 4 shows an alternative auto-tuning method that can reduce the time needed to complete auto-tuning.

FIG. 4 shows an alternative auto-tuning method 400 that can reduce the time needed to complete auto-tuning. In the method of FIG. 4, the voltage level of the feedback signal is measured as the capacitance value of the variable capacitor is gradually increased or decreased. The inventor(s) have recognized that the voltage level of the feedback signal may have a single peak at or near resonance. Accordingly, the method may test capacitance values as they are swept through a range of values until the voltage level of the feedback starts to decrease, which indicates that the peak has been reached. Accordingly, the capacitance value tested prior to the decrease may be selected in step 406 and used for reading the RFID tag.

Other optimizations may be used. For example, in some embodiments the variable capacitor may be initialized in step 301 to the last known best tuning value. In step 305, the capacitance value may be modified by testing capacitance values close to the last known best tuning value prior to testing values at the extremes. For example, after the last known best tuning value is tested, the capacitance may be increased by 1C and tested, then decreased by 2C and tested, then increased by 3C and tested. Alternatively, after the last known best tuning value is tested, the capacitance may be decreased by 1C and tested, then increased by 2C and tested, then decreased by 3C and tested, to successively test values closed to the last known best tuning value first. However, this is by way of example, and a variety of suitable orders may be used for testing the capacitance values. In some embodiments, the testing may stop once a maximum is found, as in method 400.

In some embodiments, prior to step 301 an initial tuning procedure may be performed without waiting for card initialization to be performed before measurements. The initial tuning procedure may be similar to methods 300 or 400, without step 303. The result of the initial tuning procedure may be used as the last known best tuning value for the technique described in the preceding paragraph.

Auto-tuning method 300 and/or 400 may be initiated at any suitable time. In some embodiments, auto-tuning method 300 and/or 400 may be initiated each time the transmitter/receiver 6 is activated to look for a card/tag. In some embodiments, auto-tuning method 300 and/or 400 may be initiated upon initial power-up of the RFID reader 200. In some embodiments, the auto-tuning method may be repeated as the card/tag is tracked within the field of the RFID reader.

Additional Aspects

In some embodiments, techniques described herein may be carried out using one or more computing devices. Embodiments are not limited to operating with any particular type of computing device.

Figure 5:
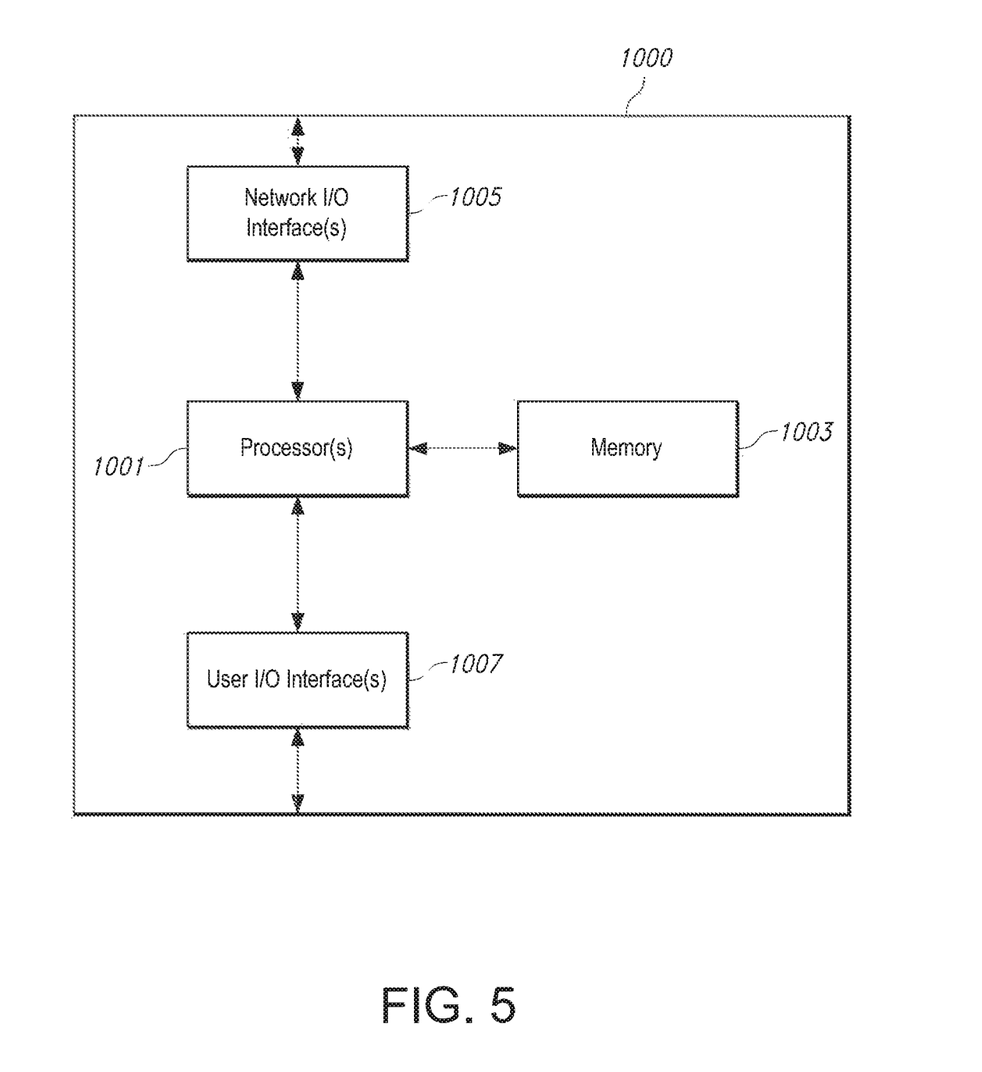
FIG. 5 is a block diagram of an illustrative computing device that may be used by the RFID reader to control the auto-tuning process.

FIG. 5 is a block diagram of an illustrative computing device 1000 that may be used by the RFID reader 200 to control the auto-tuning process. Computing device 1000 may include one or more processors 1001 and one or more tangible, non-transitory computer-readable storage media (e.g., memory 1003). Memory 1003 may store, in a tangible non-transitory computer-recordable medium, computer program instructions that, when executed, implement any of the above-described functionality. Processor(s) 1001 may be coupled to memory 1003 and may execute such computer program instructions to cause the functionality to be realized and performed.

Computing device 1000 may also include a network input/output (I/O) interface 1005 via which the computing device may communicate with other computing devices (e.g., over a network), and may also include one or more user I/O interfaces 1007, via which the computing device may provide output to and receive input from a user. The user I/O interfaces may include devices such as a keyboard, a mouse, a microphone, a display device (e.g., a monitor or touch screen), speakers, a camera, and/or various other types of I/O devices.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments described herein comprises at least one computer-readable storage medium (e.g., RAM, ROM, EEPROM, flash memory or other memory technology, CD-ROM, digital versatile disks (DVD) or other optical disk storage, magnetic cassettes, magnetic tape, magnetic disk storage or other magnetic storage devices, or other tangible, non-transitory computer-readable storage medium) encoded with a computer program (i.e., a plurality of executable instructions) that, when executed on one or more processors, performs the above-discussed functions of one or more embodiments. The computer-readable medium may be transportable such that the program stored thereon can be loaded onto any computing device to implement aspects of the techniques discussed herein. In addition, it should be appreciated that the reference to a computer program which, when executed, performs any of the above-discussed functions, is not limited to an application program running on a host computer. Rather, the terms computer program and software are used herein in a generic sense to reference any type of computer code (e.g., application software, firmware, microcode, or any other form of computer instruction) that can be employed to program one or more processors to implement aspects of the techniques discussed herein.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An auto-tuning method for an RFID reader including a variable matching network, the auto-tuning method comprising:

setting an impedance of the variable matching network to a first value;

transmitting a carrier signal;

measuring a first feedback signal produced in a voltage feedback network of the RFID reader when transmitting the carrier signal with the impedance of the variable matching network set at the first value, the voltage feedback network being configured to generate, at a receive terminal of the RFID reader, the first feedback signal that comprises at least a portion of the carrier signal in a transmit signal path at an input of the variable matching network;

setting the impedance of the variable matching network to a second value, the second value being different from the first value;

proceeding, in an iterative or recursive manner, starting with the impedance of the variable matching network set at the second value:

to measure a second feedback signal produced in the RFID reader when transmitting the carrier signal with the impedance of the variable matching network set at the second value;

to compare the respective first and second feedback signals; and when the second feedback signal is greater than the first feedback signal, to use the second feedback signal acting as the first feedback signal and to set the impedance of the variable matching network to a new second value for a next iteration;

when the second feedback signal is less than the first feedback signal, setting the variable matching network to the first impedance value for reading an RFID tag;

wherein the voltage feedback network comprises a plurality of capacitors connected in series and configured as an AC voltage divider.

2. The auto-tuning method of claim 1, wherein performing a first iteration of measuring the first feedback signal comprises setting an initial impedance value of the variable matching network based on a last known best tuning value for the variable matching network.

3. The auto-tuning method of claim 2, wherein the last known best tuning value is determined by tuning the variable matching network without waiting for initialization of an RFID tag in a field of the RFID reader.

4. The auto-tuning method of claim 1, wherein each of the first and second feedback signals represents a voltage of the variable matching network.

5. The auto-tuning method of claim 1, wherein each of the first and second feedback signals is representative of a corresponding voltage in a transmit signal path of the RFID reader when the impedance of the variable matching network is set at the first and second values, respectively.

6. The auto-tuning method of claim 1, wherein the variable matching network comprises a variable capacitor, and wherein the first and second values are capacitance values.

7. The auto-tuning method of claim 1, further comprising waiting a prescribed period of time to initialize the RFID tag between transmitting the carrier signal and measuring the first feedback signal.

8. The auto-tuning method of claim 1, wherein the first and second feedback signals are measured at a receive terminal of the RFID reader.

9. The auto-tuning method of claim 1, wherein the method is performed by the RFID reader each time an RFID tag is read.

10. An auto-tuning method for an RFID reader including a variable matching network, the auto-tuning method comprising:
setting an impedance of the variable matching network to an initial value;
transmitting a carrier signal;
proceeding, in an iterative manner, starting with the impedance of the variable matching network set at the initial value:
to measure a feedback signal produced in a voltage feedback network of the RFID reader when transmitting the carrier signal, the voltage feedback network being configured to generate, at a receive terminal of the RFID reader, the feedback signal that comprises at least a portion of the carrier signal in a transmit signal path at an input of the variable matching network;
to store an amplitude of the feedback signal; and
to set the impedance of the variable matching network to a different value acting as the initial value for a next iteration, until all unique impedance values of the variable matching network have been used;
comparing the stored amplitudes of each of the respective feedback signals with one another to determine which of the stored amplitudes is highest; and
setting the variable matching network to the impedance value corresponding to the highest stored amplitude of the feedback signals; wherein the voltage feedback network comprises a plurality of capacitors connected in series and configured as an AC voltage divider.

11. The auto-tuning method of claim 10, wherein the initial value of the impedance to which the variable matching network is set in a first iteration is based on a last known best tuning value for the variable matching network.

12. The auto-tuning method of claim 11, wherein the last known best tuning value is determined by tuning the variable matching network without waiting for initialization of an RFID tag in a field of the RFID reader.

13. The auto-tuning method of claim 10, wherein the feedback signal is representative of a voltage in a transmit signal path of the RFID reader.

14. The auto-tuning method of claim 10, wherein the variable matching network comprises a variable capacitor, and wherein the impedance values are capacitance values.

15. The auto-tuning method of claim 10, further comprising waiting a prescribed period of time to initialize the RFID tag between transmitting the carrier signal and measuring the feedback signal.

16. The auto-tuning method of claim 10, wherein the feedback signals are measured at a receive terminal of the RFID reader.

* * * * *